(12) United States Patent
Ko

(10) Patent No.: US 9,048,361 B2
(45) Date of Patent: Jun. 2, 2015

(54) PHOTOVOLTAIC MODULE

(75) Inventor: Min Jin Ko, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 13/554,450

(22) Filed: Jul. 20, 2012

(65) Prior Publication Data

US 2013/0014820 A1    Jan. 17, 2013

Related U.S. Application Data

(63) Continuation of application No. PCT/KR2011/000522, filed on Jan. 25, 2011.

(30) Foreign Application Priority Data

Jan. 25, 2010 (KR) .................. 10-2010-0006695
Jan. 25, 2011 (KR) .................. 10-2011-0007450

(51) Int. Cl.
*H01L 31/042* (2014.01)
*H01L 31/055* (2014.01)
*H01L 31/048* (2014.01)
*B32B 17/10* (2006.01)

(52) U.S. Cl.
CPC .......... *H01L 31/055* (2013.01); *H01L 31/0481* (2013.01); *B32B 17/10018* (2013.01); *B32B 17/10798* (2013.01); *Y02E 10/52* (2013.01)

(58) Field of Classification Search
CPC ................................................ B23B 17/10798
USPC ................................................ 136/251, 259
See application file for complete search history.

(56) References Cited

U.S. PATENT DOCUMENTS

| | | | |
|---|---|---|---|
| 2003/0000568 A1 | 1/2003 | Gonsiorawski | |
| 2008/0276983 A1* | 11/2008 | Drake et al. | 136/251 |
| 2009/0203837 A1* | 8/2009 | Morita et al. | 524/588 |
| 2011/0177342 A1* | 7/2011 | Itoh et al. | 428/414 |

FOREIGN PATENT DOCUMENTS

| | | |
|---|---|---|
| CN | 101166792 A | 4/2008 |
| CN | 101548391 A | 9/2009 |
| JP | 10-321886 A | 12/1998 |
| JP | 2002-033496 A | 1/2002 |
| JP | 2006-303033 A | 11/2006 |
| KR | 1020080072834 A | 8/2008 |
| KR | 1020090090765 A | 8/2009 |
| KR | 10-2009-0131274 A | 12/2009 |
| WO | WO 2010004932 A1 * | 1/2010 |

OTHER PUBLICATIONS

Baik, Jang, Derwent of KR 2009090765 published Aug. 2009, 1-3.*
International Search Report issued in International Appn. No. PCT/KR2011/000522, mailed Sep. 26, 2011, 2 pages.
Office Action issued by the Patent Office of the People's Republic of China in corresponding Application No. 201180006116.0 dated Jul. 11, 2014, 21 pages.

* cited by examiner

*Primary Examiner* — Eli Mekhlin
(74) *Attorney, Agent, or Firm* — Rothwell, Figg, Ernst & Manbeck, P.C.

(57) ABSTRACT

A photovoltaic module is provided. The photovoltaic module has excellent electricity generation efficiency and durability.

11 Claims, 1 Drawing Sheet

PHOTOVOLTAIC MODULE

CROSS REFERENCE TO RELATED APPLICATION

The present application is a continuation application of International Application PCT/KR2011/000522, with an international filing date of Jan. 25, 2011, which claims priority to and the benefit of Korean Patent Application No. 10-2010-0006695, filed Jan. 25, 2010, and of Korean Patent Application No. 10-2011-0007450, filed Jan. 25, 2011, the disclosures of which are incorporated herein by reference in their entireties.

TECHNICAL FIELD

The present invention relates to a photovoltaic module.

BACKGROUND ART

A photovoltaic cell or a solar cell is a cell capable of converting light energy into electric energy by using a photoelectric transformation element that is capable of generating photovoltaic power, when exposed to light. When the photovoltaic cell is exposed to light, it generates a voltage through terminals thereof and induces a flow of electrons. The magnitude of the electron flow is proportional to the collision strength of light on a photovoltaic cell junction formed on a cell surface.

Kinds of photovoltaic cells include a silicon wafer photovoltaic cell and a thin film photovoltaic cell. The silicon wafer photovoltaic cell includes a photoelectric transformation element prepared using a single crystal or polycrystalline silicon ingot, and a photoelectric transformation element used in the thin film photovoltaic cell is deposited on a substrate or a ferroelectric using a method such as sputtering or deposition.

Since the photovoltaic cell is brittle, it requires a support element for supporting the cells. The support element may be a light-transmissive front substrate arranged over a photoelectric transformation element. Also, the support element may be a back sheet arranged at the rear of the photoelectric transformation element. The photovoltaic cell may include both the light-transmissive front substrate and the back sheet. Generally, the front substrate or the back sheet may be made of rigid materials such as glass, flexible materials such as a metal film or sheet, or polymer plastic materials such as polyimides.

Generally, the back sheet is in the form of a rigid back skin to protect the rear surface of the photovoltaic cell. Various materials which may be applied to such a back sheet are known, and, for example, include a ferroelectric such as glass, an organic fluoropolymer such as ethylene tetrafluoroethylene (ETFE) or a polyester such as poly (ethylene terephthalate) (PET). Such materials may be applied alone or applied after being coated with a material such as $SiO_x$.

The photovoltaic cell includes a photoelectric transformation element or photoelectric transformation elements that are electrically connected to each other, i.e. a photoelectric transformation element array. The photoelectric transformation element or the photoelectric transformation element array is encapsulated by an encapsulant. The encapsulant is used for encapsulation of the elements to protect them from external environments and used to form an integral module.

A conventionally used encapsulant is ethylene vinyl acetate (EVA). However, the EVA has low adhesive strength to other parts of the module. Therefore, if the EVA is used for a long period of time, delamination is readily induced, as well as lowered efficiency or corrosion due to moisture permeation is induced. Also, the EVA becomes discolored due to its low UV resistance and degrades the efficiency of the modules. Furthermore, the EVA has a problem of causing damage to the elements due to internal stress generated during curing processes.

DISCLOSURE

Technical Problem

An object of the present invention is to provide a photovoltaic module.

Technical Solution

The present invention relates to a photovoltaic module that includes a support substrate; a front substrate; and an encapsulant that encapsulates a photoelectric transformation element between the support substrate and the front substrate that includes a silicon resin and a photo transformation material. The photo transformation material is capable of absorbing light having wavelengths in UV ranges and then emitting light having wavelengths in visible or near-infrared ranges.

Hereinafter, the photovoltaic module will be described in further detail.

The photovoltaic module includes the front substrate and the rear substrate. The photovoltaic module also includes the photoelectric transformation element that is encapsulated by the encapsulant between the front substrate and the rear substrate. The encapsulant includes the silicon resin and the photo transformation material. In cases where the encapsulant is a multi-layered structure including two or more layers, at least one layer of the multiple layers, preferably all the layers, may include a silicon resin and a photo transformation material.

The photoelectric transformation element may be any kinds of elements that are capable of converting light into an electric signal, and examples thereof may include a bulk type or thin film-type silicon photoelectric transformation element, a compound semiconductor photoelectric transformation element, and the like.

The silicon resin included in the encapsulant shows excellent adhesive strength with various parts and materials included in the module and which contact the encapsulant. Also the encapsulant shows excellent moisture resistance, weather resistance and lightfastness.

In one embodiment, an encapsulant that has excellent moisture resistance, weather resistance, adhesive strength and that also shows excellent light transmission efficiency to the photoelectric transformation element may be formed by using a silicon resin including an aryl group, specifically an aryl group bound to a silicon atom. Specific examples of the aryl group bound to a silicon atom are not particularly limited, but a phenyl group is preferred.

In one embodiment of the silicon resin, a molar ratio (Ar/Si) of the aryl group (Ar) bound to a silicon atom with respect to the total silicon atoms (Si) in the resin may be greater than 0.3. The molar ratio (Ar/Si) may preferably be greater than 0.5, and more preferably 0.7 or more. If the molar ratio (Ar/Si) is adjusted to be greater than 0.3, it is possible to maintain excellent moisture resistance, weather resistance and hardness of the encapsulant, as well as enhance electricity generation efficiency of the photovoltaic module. The upper limit of the molar ratio (Ar/Si) is not limited, but, for example, may be 1.5 or less or 1.2 or less.

In one embodiment, the silicon resin may be represented by an average composition formula of the following Formula 1.

$$(R_3SiO_{1/2})_a(R_2SiO_{2/2})_b(RSiO_{3/2})_c(SiO_{4/2})_d \quad \text{[Formula 1]}$$

wherein R, $R_2$ and $R_3$ are substituents directly bound to a silicon atom, and independently represent hydrogen, a hydroxy group, an epoxy group, an acryloyl group, a methacryloyl group, an isocyanate group, an alkoxy group or a monovalent hydrocarbon group, a is between 0 and 0.6, b is between 0 and 0.95, c is between 0 and 0.8, and d is between 0 and 0.4, with the provision that a+b+c+d is 1, b and c are not 0 simultaneously, and at least one of R, $R_2$ and $R_3$ represents an aryl group.

In this specification, a silicone resin being represented by a certain average composition formula means cases where the resin comprises a single resin component that is represented by the certain average composition formula as well as cases where the resin includes a mixture of at least two resin components, and an average composition of the at least two resin components is represented by the certain average composition formula.

In Formula 1, R, $R_2$ and $R_3$ are substituents that are directly bound to a silicon atom, and each of them may be the same or different from each other, and independently represents hydrogen, a hydroxy group, an epoxy group, an acryloyl group, a methacryloyl group, an isocyanate group, an alkoxy group or a monovalent hydrocarbon group. Each of R, $R_2$ and $R_3$ may be substituted with one or two or more substituents, if necessary.

In Formula 1, alkoxy may be linear, branched or cyclic alkoxy having 1 to 12 carbon atoms, preferably 1 to 8 carbon atoms, and more preferably 1 to 4 carbon atoms. Particularly, the alkoxy may include methoxy, ethoxy, propoxy, isopropoxy, butoxy, isobutoxy or tert-butoxy.

Also in Formula 1, examples of the monovalent hydrocarbon group may include an alkyl group, an alkenyl group, an aryl group or an arylalkyl group, and an alkyl group, an alkenyl group or an aryl group may be preferred.

In Formula 1, the alkyl group may be a linear, branched or cyclic alkyl group having 1 to 12 carbon atoms, preferably 1 to 8 carbon atoms, and more preferably 1 to 4 carbon atoms, and a methyl group may be preferred.

Also in Formula 1, the alkenyl group may be an alkenyl group having 2 to 12 carbon atoms, preferably 2 to 8 carbon atoms, and more preferably 2 to 4 carbon atoms, and a vinyl group may be preferred.

Also in Formula 1, the aryl group may be an aryl group having 6 to 18 carbon atoms, preferably 6 to 12 carbon atoms, and a phenyl group may be preferred.

Further, in Formula 1, the arylalkyl group may be an arylalkyl group having 6 to 19 carbon atoms, preferably 6 to 13 carbon atoms, and a benzyl group may be preferred.

In Formula 1, at least one of R, $R_2$ and $R_3$ may be an aryl group, preferably a phenyl group, and a substituent may be included in the silicon resin such that the molar ratio (Ar/Si) as described above may be satisfied.

Also in Formula 1, at least one of R, $R_2$ and $R_3$ may preferably be a hydroxy group, an epoxy group, an acryloyl group, a methacryloyl group or a vinyl group, and more preferably an epoxy group. Such a functional group may act to further improve adhesive strength of the encapsulant.

In Formula 1, a, b, c and d represent a mole fraction of the siloxane units, respectively, and the total sum of a, b, c and d is 1. Also in Formula 1, a may be between 0 and 0.6, preferably between 0 and 0.5, b may be between 0 and 0.95, preferably between 0 and 0.9, c may be between 0 and 0.8, preferably between 0 and 0.7, and d is between 0 and 0.4, preferably between 0 and 0.2, with proviso that b and c are not 0 simultaneously.

In one embodiment, the silicon resin of Formula 1 may preferably include at least one of the siloxane units represented by Formulas 2 and 3. Also, the total aryl groups bound to a silicon atom in the silicon resin may be preferably included in the siloxane unit represented by the following Formulas 2 or 3:

$$R^1R^2SiO_{2/2} \quad \text{[Formula 2]}$$

$$R^3SiO_{3/2} \quad \text{[Formula 3]}$$

wherein $R^1$ and $R^2$ independently represent an alkyl group or an aryl group, and $R^3$ represents an aryl group with the provision that at least one of $R^1$ and $R^2$ is an aryl group.

The siloxane unit of Formula 2 may be a siloxane unit that includes at least one aryl group bound to a silicon atom. In this case, the aryl group may preferably be a phenyl group. Also, the alkyl group in the siloxane unit of Formula 2 may preferably be a methyl group.

In one embodiment, the siloxane unit of Formula 2 may be at least one unit selected from siloxane units of Formulas 4 and 5.

$$(C_6H_5)(CH_3)SiO_{2/2} \quad \text{[Formula 4]}$$

$$(C_6H_5)_2SiO_{2/2} \quad \text{[Formula 5]}$$

Also, the siloxane unit of Formula 3 may be a trifunctional siloxane unit that includes an aryl group bound to a silicon atom, and preferably be a siloxane unit represented by the following Formula 6.

$$(C_6H_5)SiO_{3/2} \quad \text{[Formula 6]}$$

In the silicon resin, total aryl groups bound to a silicon atom may be preferably included in the siloxane unit of Formula 2 or 3. In this case, the siloxane unit of Formula 2 may be preferably the siloxane unit of Formula 4 or 5, and the siloxane unit of Formula 3 may be preferably the siloxane unit of Formula 6.

In one embodiment, the silicon resin may have a molecular weight of 500 to 100,000, preferably 1,000 to 100,000. If the molecular weight of the resin is adjusted to the above range, the encapsulant may have excellent hardness and may also show excellent processability. In the present invention, unless stated herein otherwise, the term "molecular weight" refers to a weight average molecular weight ($M_w$). Also, a weight average molecular weight refers to a value converted with respect to standard polystyrene and may be measured by gel permeation chromatography (GPC).

In one embodiment, the silicon resin may be any one of silicon resins represented by the following Formulas 7 to 20, but is not limited thereto.

$$(ViMe_2SiO_{1/2})_2(MePhSiO_{2/2})_{30} \quad \text{[Formula 7]}$$

$$(ViMe_2SiO_{1/2})_2(Ph_2SiO_{2/2})_{10}(Me_2SiO_{2/2})_{10} \quad \text{[Formula 8]}$$

$$(ViMe_2SiO_{1/2})_2(Ph_2SiO_{2/2})_{15}(Me_2SiO_{2/2})_{15}(MeEpSiO_{2/2})_5 \quad \text{[Formula 9]}$$

$$(ViMe_2SiO_{1/2})_3(PhSiO_{3/2})_{10} \quad \text{[Formula 10]}$$

$$(ViMe_2SiO_{1/2})_3(PhSiO_{3/2})_{10}(MeSiO_{3/2})_2 \quad \text{[Formula 11]}$$

$$(ViMe_2SiO_{1/2})_3(PhSiO_{3/2})_{10}(MeEpSiO_{2/2})_5 \quad \text{[Formula 12]}$$

$$(HMe_2SiO_{1/2})_3(PhSiO_{3/2})_{10} \quad \text{[Formula 13]}$$

$$(ViMe_2SiO_{1/2})_2(EpSiO_{3/2})_3(MePhSiO_{2/2})_{20} \quad \text{[Formula 14]}$$

$$(HMe_2SiO_{1/2})_3(PhSiO_{3/2})_{10}(MeEpSiO_{2/2})_5 \quad \text{[Formula 15]}$$

$$(HMe_2SiO_{1/2})_2(Ph_2SiO_{2/2})_{1.5} \quad \text{[Formula 16]}$$

$$(PhSiO_{3/2})_{10}(MePhSiO_{2/2})_{10}(Me_2SiO_{2/2})_{10} \quad \text{[Formula 17]}$$

$$(PhSiO_{3/2})_5(EpMeSiO_{2/2})_2(Me_2SiO_{2/2})_{10} \quad \text{[Formula 18]}$$

$$(PhSiO_{3/2})_5(AcSiO_{3/2})_5(MePhSiO_{2/2})_{10} \quad \text{[Formula 19]}$$

$$(PhSiO_{3/2})_{10}(AcSiO_{3/2})_5(ViMe2SiO_{1/2})_5 \quad \text{[Formula 20]}$$

In Formulas 7 to 20, "Me" represents a methyl group, "Ph" represents a phenyl group, "Ac" represents an acryloyl group, and "Ep" represents an epoxy group.

Such a silicon resin may be prepared by various methods known in the art. For example, the silicon resin may be prepared, for example, using an addition-curable silicon material, a condensation-curable or polycondensation-curable silicon material, a UV-curable silicon material or a peroxide-vulcanized silicon material, and preferably prepared using an addition-curable silicon material, a condensation-curable or polycondensation-curable silicon material or a UV-curable silicon material.

The addition-curable silicon material may be cured by hydrosilylation. This material includes at least an organic silicon compound having at least one hydrogen atom directly bound to a silicon atom and an organic silicon compound having at least one unsaturated aliphatic group such as a vinyl group. The organic silicon compounds react with each other to be cured in the presence of a catalyst. Examples of the catalyst may include metals of Group VIII in the Periodic Table; catalysts in which the metals are supported in a support such as alumina, silica or carbon black; or salts or complexes of the metals. The metals of Group VIII which may be used herein include platinum, rhodium or ruthenium, platinum being preferred.

A method using the condensation-curable or polycondensation-curable silicon material includes preparing a silicon resin by means of hydrolysis and condensation of a silicon compound or a hydrolysate thereof, such as silane or siloxane, which has a hydrolyzable functional group such as a halogen atom or an alkoxy group. A unit compound usable in this method may include a silane compound such as $R^a_3Si(OR^b)$, $R^a_2Si(OR^b)_2$, $R^aSi(OR^b)_3$ and $Si(OR^b)_4$. In the silane compound, $(OR^b)$ may represent a linear or branched alkoxy group having 1 to 8 carbon atoms, and more particularly, may be methoxy, ethoxy, n-propoxy, n-butoxy, isopropoxy, isobutoxy, sec-butoxy or t-butoxy. Also in the silane compound, $R^a$ is a functional group bound to a silicon atom, and may be selected in consideration of substituents in a desired silicon resin.

A method using the UV-curable silicon material includes subjecting a silicon compound or a hydrolysate thereof, such as silane or siloxane having a UV-reactive group such as an acryloyl group, to hydrolysis and condensation to prepare a resin, and then preparing the desired resin by UV irradiation to the silicon resin.

The addition-curable, condensation-curable or polycondensation-curable, or UV-curable silicon materials are widely known in the art, and a desired resin may be readily prepared using the materials known to a person skilled in the art, according to a desired silicon resin.

The encapsulant includes a photo transformation material along with the silicon resin. The photo transformation material may convert light having wavelengths in UV (ultraviolet) ranges among light that enters therein into light having wavelengths in visible or near-infrared ranges. Therefore, the material may improve electricity generation efficiency of the photovoltaic module. In particular, in the encapsulant, the silicon resin does not absorb light having wavelengths in UV ranges, and therefore makes it possible to maximize an effect of using the photo transformation material.

The photo transformation material usable herein may include any materials that are able to absorb light having wavelengths in UV ranges and then emit light having wavelengths in visible or near-infrared ranges, but is not particularly limited thereto.

In one embodiment, the photo transformation material may be represented by the following Formula 21:

$$Eu_wY_xO_yS_z \qquad \text{[Formula 21]}$$

wherein w is between 0.01 and 0.2, x is between 2 and 3, y is between 2 and 3, and z is between 0 and 1.

In the encapsulant, the photo transformation material may be included in an amount of 0.1 parts by weight to 10 parts by weight, preferably 0.2 parts by weight to 5 parts by weight, relative to 100 parts by weight of the silicon resin. If the content of the photo transformation material is adjusted within the range, it is possible to prevent photonic efficiency from being lowered due to light diffusion and to maximize photo transformation effect. Throughout this specification, the term "parts by weight" refers to a weight ratio, unless stated herein otherwise.

The encapsulant may further include any known components such as fillers in addition to the silicon resin and the photo transformation material.

The photovoltaic module may be formed in various shapes.

FIGS. 1 and 2 are schematic diagrams showing an exemplary photovoltaic module.

FIG. 1 shows a photovoltaic module (1) including a wafer element as a photoelectric transformation element according to one embodiment. The photovoltaic module shown in FIG. 1 may generally include a front substrate (11) made of a ferroelectric such as glass; a back sheet (14) which may be Tedlar or a laminated sheet of PET/SiOx-PET/Al; a silicon wafer photoelectric transformation element (13); and encapsulants (12a and 12b) encapsulating the photoelectric transformation element (13). In this case, the encapsulant may include an upper encapsulant layer (12a) which is attached to the front substrate (11) in order to encapsulate the photoelectric transformation element (13) and a lower encapsulant layer (12b), which is attached to the support substrate (14) in order to encapsulate the photoelectric transformation element (13). In this case, one of the upper and lower encapsulant layers (12a and 12b) may include the components as described above; however, preferably both the upper and lower encapsulant layers (12a and 12b) may include the components as described above.

FIG. 2 is a schematic view of a thin film photovoltaic module (2) according to another embodiment. As shown in FIG. 2, in the thin film photovoltaic module (2), the photoelectric transformation element (23) may be formed on the front substrate (21) by, for example, a deposition method.

In the present invention, methods to prepare various photovoltaic modules as described above are not particularly limited, and various methods known in the art may be suitably applied.

For example, a photovoltaic module may be prepared by preparing an encapsulating sheet by the components included in the encapsulant, and then subjecting the sheet to a lamination method so as to prepare the module. For example, a photovoltaic module may be prepared by laminating the front substrate, the photoelectric transformation element, the back sheet and the encapsulating sheet according to the desired structure of the module, and then heating and pressing the laminate.

As another method, the photovoltaic module may be prepared by a method including coating a liquefied silicon resin composition including the photo transformation material around the photoelectric transformation element, and then curing the coated composition so as to form the encapsulant. In this case, the silicon resin composition may include a silicon resin represented by the average composition formula of Formula 1 as described above, or an addition-curable, condensation-curable or polycondensation-curable or UV-curable silicon material which may form the silicon resin.

Advantageous Effects

The encapsulant in the photovoltaic cell has excellent moisture resistance, weather resistance, lightfastness and demonstrates excellent adhesive strength to other parts of the photovoltaic cell. Also, the encapsulant may act to effectively transmit incident light to a photoelectric transformation element and convert the incident light into light of wavelengths which is suitable for use in the photoelectric transformation element. Therefore, according to the present invention, a photovoltaic cell having excellent durability and electricity generation efficiency may be provided.

BEST MODE

Figure 1:
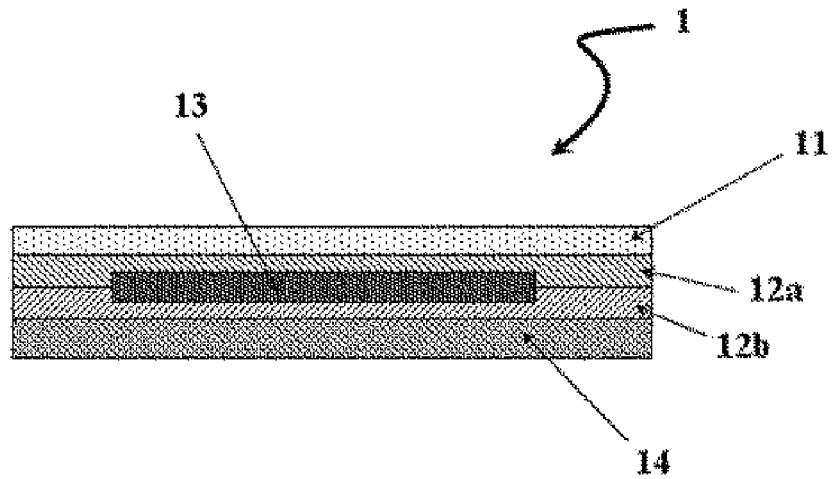
FIGS. 1 and 2 show exemplary photovoltaic modules.
1: a wafer photovoltaic module
2: a thin film photovoltaic module
11, 21: front substrates
12a, 12b, 22: encapsulant sheets
13, 23: photoelectric transformation elements
14, 24: back sheets
Figure 2:
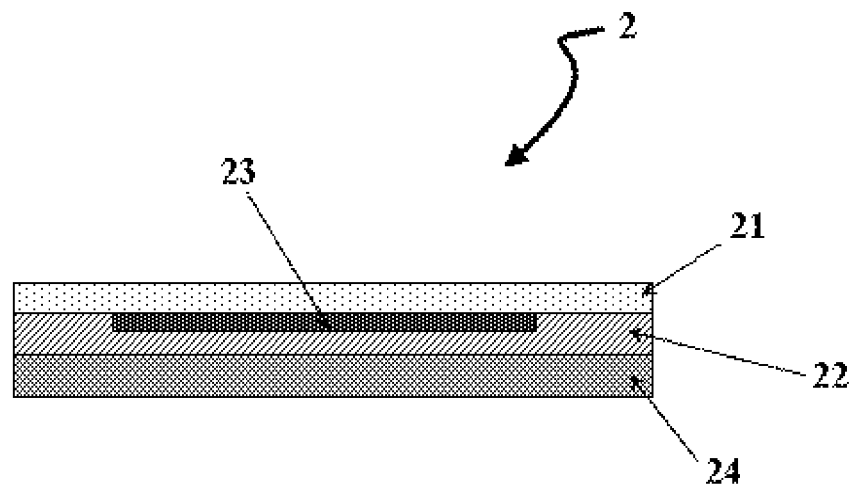

Hereinafter, the present invention will be described in further detail referring to Examples according to the present invention and Comparative Examples that are not according to the present invention; however, the present invention is not limited to Examples.

In Examples and Comparative Examples, the symbol "Vi" represents a vinyl group, the symbol "Me" represents a methyl group, the symbol "Ph" represents a phenyl group, and the symbol "Ep" represents an epoxy group.

Example 1

Preparation of Composition (A) and (B) for Encapsulant

The organosiloxane compounds which were synthesized by a known method and which were represented by the following Formulas A, B, C and D respectively, were mixed so as to prepare a siloxane composition capable of being cured by hydrosilylation (Mixing amounts: Compound A 100 g, Compound B 10 g, Compound C 200 g and Compound D 60 g). Then, a catalyst (platinum(0)-1,3-divinyl-1,1,3,3-tetramethyldisiloxane) was blended at such an amount that the content of Pt(0) in the siloxane composition was 20 ppm, and homogeneously mixed to prepare resin composition (A). 8 g of a photo transformation material ($Eu_{0.09}Y_2O_2S$) was further mixed with the resin composition (A), and homogeneously mixed so as to prepare resin composition (B) for an encapsulant.

$(ViMe_2SiO_{1/2})_2(ViMeSiO_{2/2})_2(Ph_2SiO_{2/2})_{20}$
$(Me_2SiO_{2/2})_{20}$ [Formula A]

$(ViMe_2SiO_{1/2})_2(EpSiO_{3/2})_3(MePhSiO_{2/2})_{20}$ [Formula B]

$(ViMe_2SiO_{1/2})_3(MePhSiO_{2/2})_1(PhSiO_{3/2})_7$ [Formula C]

$(HMe_2SiO_{1/2})_2(Ph_2SiO_{2/2})_{1.5}$ [Formula D]

Preparation of Photovoltaic Module

The resin composition (A) as prepared above was coated on a glass substrate for a photovoltaic module, and then was cured at 100° C. for 1 hour. Then, a photoelectric transformation element was placed on the cured resin composition (A), and then resin composition (B) was coated on the photoelectric transformation element. Then, the coated resin composition (B) was cured at 150° C. for 1 hour, and then a back sheet was heat-pressed thereon so as to prepare a photovoltaic module.

Comparative Example 1

A photovoltaic module was prepared in the same manner as in Example 1, except that only resin composition (A) was used instead of resin composition (B) for an encapsulant.

Comparative Example 2

Preparation of Composition (C) for Encapsulant

The organosiloxane compounds which were synthesized by a known method, and which were represented by the Formulas E to G were mixed together so as to prepare a siloxane composition capable of being cured by hydrosilylation (Mixing amounts: Compound E 100 g, Compound F 20 g and Compound G 50 g). Then, a catalyst (platinum(0)-1,3-divinyl-1,1,3,3-tetramethyldisiloxane) was mixed at such an amount that the content of Pt(0) in the siloxane composition was 20 ppm, and homogeneously mixed to prepare resin composition (C).

$(ViMe_2SiO_{1/2})_2(ViMeSiO_{2/2})_{15}(MeSiO_{3/2})_5$
$(Me_2SiO_{2/2})_{50}$ [Formula E]

$(ViMe_2SiO_{1/2})_3(MeSiO_{3/2})_4(PhSiO_{3/2})_{15}$ [Formula F]

$(HMe_2SiO_{1/2})_2(HMeSiO_{2/2})_2(Me_2SiO_{2/2})_{10}$ [Formula G]

Preparation of Photovoltaic Module

The resin composition (C) for an encapsulant was coated onto the same glass substrate for a photovoltaic module as used in Example 1, and cured at 100° C. for 1 hour. Subsequently, the same photoelectric transformation element as used in Example 1 was placed on the cured resin composition, and resin composition (C) for an encapsulant was then coated on the photoelectric transformation element. Then, the coated resin composition (C) was cured at 150° C. for 1 hour, and the same back sheet as used in Example 1 was heat-pressed to prepare a photovoltaic module.

Comparative Example 3

Preparation of Composition (D) for Encapsulant

The organosiloxane compounds which were synthesized using a known method, and which were represented by the Formulas H to J were mixed together so as to prepare a siloxane composition capable of being cured by hydrosilylation (Mixing amounts: Compound H 100 g, Compound I 20 g, and Compound J 50 g). Then, a catalyst (platinum(0)-1,3-divinyl-1,1,3,3-tetramethyldisiloxane) was mixed at such an amount that the content of Pt(0) in the siloxane composition was 20 ppm, and homogeneously mixed to prepare resin composition (D).

$(ViPh_2SiO_{1/2})_2(Me_2SiO_{2/2})_{20}$ [Formula H]

$(ViPh_2SiO_{1/2})_3(MeSiO_{3/2})_{10}$ [Formula I]

$(HMe_2SiO_{1/2})_2(HMeSiO_{2/2})_2(Me_2SiO_{2/2})_{10}$ [Formula J]

Preparation of Photovoltaic Module

The resin composition (D) for an encapsulant was coated on the same glass substrate for a photovoltaic module as used in Example 1, and cured at 100° C. for 1 hour. Subsequently, the same photoelectric transformation element as used in Example 1 was placed on the cured resin composition, and resin composition (D) for an encapsulant was then coated on the photoelectric transformation element. Then, the coated resin composition (D) was cured at 150° C. for 1 hour, and the same back sheet as used in Example 1 was heat-pressed to prepare a photovoltaic module.

Comparative Example 4

A photovoltaic module was prepared in the same manner as described in Example 1, except that an EVA sheet for an encapsulant, which has been conventionally used for preparation of a photovoltaic module, was used instead of resin compositions (A) and (B).

1. Evaluation of Power Generation of Photovoltaic Module

Efficiencies of the photovoltaic modules prepared in Example and Comparative Examples were evaluated using a sum simulator. More particularly, glass substrates of the photovoltaic modules were irradiated with a light source of approximately 1 kW for the same period of time, and electricity generation capacities of the photovoltaic modules were measured. The measurement results are summarized and listed in the following Table 1.

TABLE 1

|  | Example 1 | Comparative Example 1 | Comparative Example 2 | Comparative Example 3 | Comparative Example 4 |
|---|---|---|---|---|---|
| Power Generation Efficiency | 9.65% | 9.45% | 9.3% | 9.0% | 9.2% |

2. Moisture Permeability, Durability/Reliability and Yellowing Preventing Effect (1) Measurement of Moisture Permeability Composition (A) of Example 1, composition (C) of Comparative Example 2, and composition (D) of Comparative Example 3 were cured at 150° C. for 1 hour respectively, so as to prepare 1 mm-thick planar test samples, and also a sheet for an EVA encapsulant used in Comparative Example 4 was used to prepare a 1 mm-thick planar test sample. Then, the prepared planar test samples were measured for moisture permeability. Moisture permeability of the planar test samples was measured in a thickness direction in the same conditions using a Mocon tester, and the results are listed in the following Table 2.

(2) Measurement of Reliability Under High-Temperature and High-Moisture Conditions Composition (A) of Example 1, composition (C) of Comparative Example 2, and composition (D) of Comparative Example 3 were coated at a uniform thickness on glass substrates, cured and then kept at a temperature of 85° C. and relative moisture of 85% for 500 hours. Then, peel strengths of cured products of the compositions with respect to the glass substrates were evaluated by a peel test, and values of the peel strengths were evaluated according to the following criteria, thereby evaluating reliability of the cured products under high-temperature and high-moisture conditions.

<Evaluation Criteria>
∘: Peel strength with respect to a glass substrate is similar to or greater than 15 gf/mm
x: Peel strength with respect to a glass substrate is less than 15 gf/mm (3) Measurement of Yellowing Level Each test sample used to measure the moisture permeability was illuminated with light at 60° C. for 3 days using a Q-UVA (340 nm, 0.89 W/Cm$^2$) tester, and evaluated for yellowing according to the following criteria. The results are described, as follows.

<Evaluation Criteria>
∘: Absorbance of light having 450 nm wavelength is less than 5%
x: Absorbance of light having 450 nm wavelength is more than 5%

TABLE 2

|  | Example 1 (Composition (A)) | Comparative Example 2 (Composition (C)) | Comparative Example 3 (Composition (D)) | Comparative Example 4 (EVA) |
|---|---|---|---|---|
| Moisture Permeability | 15 g/cm$^2$/day | 106 g/cm$^2$/day | 120 g/cm$^2$/day | 12 g/cm$^2$/day |
| Durability/Reliability | ∘ | x | x | — |
| Yellowing | ∘ | ∘ | x | x |

The invention claimed is:

1. A photovoltaic module, comprising:
a support substrate;
a front substrate; and
an encapsulant that encapsulates a photoelectric transformation element between the support substrate and the front substrate, and which comprises a silicon resin formed from hydrosilylation of an addition-curable material and represented by an average composition formula of Formula 1 and a photo transformation material capable of absorbing light having wavelengths in ultraviolet ranges and then capable of emitting light having wavelengths in visible or near-infrared ranges:

$(R_3SiO_{1/2})_a(R_2SiO_{2/2})_b(RSiO_{3/2})_c(SiO_{4/2})_d$      [Formula 1]

wherein each R represents a substituent directly bound to the silicon atoms, and each R independently represents hydrogen, a hydroxy group, an epoxy group, an acryloyl group, a methacryloyl group, an isocyanate group, an alkoxy group or a monovalent hydrocarbon group, with the provision that at least one R represents an aryl group and at least one R represents an epoxy group; a is between 0 and 0.6, b is between 0 and 0.95, c is between 0 and 0.7, d is between 0 and 0.4, and a+b+c+d is 1, with the provision that b and c are not 0 simultaneously.

2. The photovoltaic module according to claim 1, wherein a molar ratio of the aryl group that is bound to a silicon atom with respect to the total silicon atoms included in the silicon resin is greater than 0.3, and also is not more than 1.5.

3. The photovoltaic module according to claim 1, wherein a molar ratio of the aryl group that is bound to a silicon atom with respect to the total silicon atoms included in the silicon resin is greater than 0.5, and also is not more than 1.5.

4. The photovoltaic module according to claim 1, wherein a molar ratio of the aryl group that is bound to a silicon atom with respect to the total silicon atoms included in the silicon resin is in the range from 0.7 to 1.5.

5. The photovoltaic module according to claim 1, wherein the silicon resin represented by the average composition formula of Formula 1 comprises a siloxane unit of Formula 2 or 3:

$R^1R^2SiO_{2/2}$      [Formula 2]

$R^3SiO_{3/2}$      [Formula 3]

wherein $R^1$ and $R^2$ each independently represent an alkyl group or an aryl group, with the provision that at least one of $R^1$ and $R^2$ represents an aryl group; and $R^3$ represents an aryl group.

6. The photovoltaic module according to claim 5, wherein the total aryl groups bound to the silicon atom in the silicon resin are comprised in the siloxane unit of Formula 2 or 3.

7. The photovoltaic module according to claim 5, wherein the siloxane unit of Formula 2 is at least one selected from the group consisting of siloxane units of Formulas 4 and 5:

$(C_6H_5)(CH_3)SiO_{2/2}$      [Formula 4]

$(C_6H_5)_2SiO_{2/2}$      [Formula 5].

8. The photovoltaic module according to claim 5, wherein the siloxane unit of Formula 3 is a siloxane unit of Formula 6:

$$(C_6H_5)SiO_{3/2} \qquad \text{[Formula 6]}.$$

9. The photovoltaic module according to claim 1, wherein the silicon resin has a weight average molecular weight of 500 to 100,000.

10. The photovoltaic module according to claim 1, wherein the photo transformation material is represented by the following Formula 21:

$$Eu_w Y_x O_y S_z \qquad \text{[Formula 21]}$$

wherein w is in range from 0.01 to 0.2, x is in range from 2 to 3, y is in range from 2 to 3, and z is in range from 0 to 1.

11. The photovoltaic module according to claim 1, wherein the encapsulant includes 0.1 parts by weight to 10 parts by weight of the photo transformation material, relative to 100 parts by weight of the silicon resin.

* * * * *